(12) United States Patent
Jang et al.

(10) Patent No.: US 7,963,735 B2
(45) Date of Patent: Jun. 21, 2011

(54) HOLDER MANUFACTURING METHOD FOR LOADING SUBSTRATE OF SEMICONDUCTOR MANUFACTURING DEVICE, BATCH TYPE BOAT HAVING HOLDER, LOADING/UNLOADING METHOD OF SEMICONDUCTOR SUBSTRATE USING THE SAME, AND SEMICONDUCTOR MANUFACTURING DEVICE HAVING THE SAME

(75) Inventors: Taek Young Jang, Suwon-si (KR); Byoung Il Lee, Seongnam-si (KR)

(73) Assignee: Terasemicon Corporation, Hwaseong-si (KR)

( * ) Notice: Subject to any disclaimer, the term of this patent is extended or adjusted under 35 U.S.C. 154(b) by 1274 days.

(21) Appl. No.: 11/410,583

(22) Filed: Apr. 25, 2006

(65) Prior Publication Data

US 2006/0239799 A1     Oct. 26, 2006

(30) Foreign Application Priority Data

Apr. 25, 2005   (KR) .................. 10-2005-0033906
Dec. 8, 2005    (KR) .................. 10-2005-0119392

(51) Int. Cl.
    *B65G 49/07* (2006.01)
(52) U.S. Cl. .................. 414/185; 414/804; 414/938
(58) Field of Classification Search .......... 414/183–185, 414/160, 938, 804
    See application file for complete search history.

(56) References Cited

U.S. PATENT DOCUMENTS

| | | | | |
|---|---|---|---|---|
| 5,275,521 A | * | 1/1994 | Wada | 414/404 |
| 5,409,348 A | * | 4/1995 | Suzuki | 414/811 |
| 5,458,688 A | * | 10/1995 | Watanabe | 118/724 |
| 5,586,880 A | * | 12/1996 | Ohsawa | 432/241 |
| 6,174,011 B1 | * | 1/2001 | Keigler | 294/99.1 |
| 6,190,113 B1 | * | 2/2001 | Bui et al. | 414/672 |
| 6,344,387 B1 | * | 2/2002 | Hasebe et al. | 438/240 |
| 6,799,940 B2 | * | 10/2004 | Joe et al. | 414/672 |
| 6,976,400 B1 | * | 12/2005 | Tan | 74/490.01 |
| 2010/0061828 A1 | * | 3/2010 | Asari et al. | 414/160 |

FOREIGN PATENT DOCUMENTS

KR   10-2004-0023963     9/2002
KR   10-2006-0016937     8/2004

* cited by examiner

*Primary Examiner* — Saúl J Rodríguez
*Assistant Examiner* — Joshua I Rudawitz
(74) *Attorney, Agent, or Firm* — Mannava & Kang, P.C.

(57) ABSTRACT

A holder manufacturing method for loading a substrate of a semiconductor manufacturing device, a batch type boat having the holder, a loading/unloading method of a semiconductor substrate using the same, and a semiconductor manufacturing device having the same are disclosed. For example, the manufacturing method of the holder of the boat for loading a semiconductor substrate includes the steps of molding a holder substrate of a pipe shape having inner and outer circumference of a predetermined size in such a manner that a lower portion of the semiconductor substrate is seated thereon; and forming a plurality of holder rings by cutting the holder rings from the holder substrate in such a manner that each holder ring is matched to a disposal interval of the semiconductor substrates in the boat. The manufacture of the holder and the batch type boat are simple by means of the holder ring supported on the supporting rods and the end-effector escapes the supporting rods, so that the pitch interval can be minimized, whereby it can load the compact semiconductor substrate to the boat, the amount of the substrate treatment can be improved and thus the productivity thereof can be improved.

11 Claims, 6 Drawing Sheets

SiC powder molding → SiC coating

SiC coating → Cutting → Molding panel incineration → Cutting treatment

HOLDER MANUFACTURING METHOD FOR LOADING SUBSTRATE OF SEMICONDUCTOR MANUFACTURING DEVICE, BATCH TYPE BOAT HAVING HOLDER, LOADING/UNLOADING METHOD OF SEMICONDUCTOR SUBSTRATE USING THE SAME, AND SEMICONDUCTOR MANUFACTURING DEVICE HAVING THE SAME

BACKGROUND OF THE INVENTION

1. Field of the Invention

The present invention relates to a holder manufacturing method for loading a substrate of a semiconductor manufacturing device, a batch type boat having the holder, a loading/unloading method of a semiconductor substrate using the same, and a semiconductor manufacturing device having the same.

2. Description of the Prior Art

Generally, a semiconductor manufacturing device for treating the semiconductor substrate divides into a batch type including a boat for loading substrates in bulk therein in order to improve the processing capacity and a single wafer type for treating the process one by one in order to extremely decrease the processing time.

In these processes, since the process time is consumed in order to increase or decrease the processing temperature, a semiconductor manufacturing device of the batch type is generally used in the manufacturing process thereof, especially a process of high temperature.

FIG. 1A is an explanatory view illustrating an external appearance of a semiconductor manufacturing device including a batch type boat for loading a plurality of semiconductor substrates.

Referring to FIG. 1A, the conventional semiconductor manufacturing device of the batch type includes a reaction chamber of a tubular type for treating the semiconductor manufacturing process having a receiving space therein and an opening portion at lower portion thereof, and a boat 1 for loading the substrate and stacking the plurality of semiconductor substrates vertically.

Here, the semiconductor substrates 100 located at a cassette 3 mounted on a stage are transferred to the boat 1 through an end-effector 2.

The boat 1 includes the plural boat frames 4 of a pole type, a plurality of supporting grooves (slits) formed along the boat frames 4 at a predetermined interval, and a plurality of holders 7 for loading the semiconductor substrates inserted in the supporting grooves.

At this time, the boat 1 further includes a front opening portion 5 in regard to the working path (drawing in and out) of the end-effector 2 through the boat frame 4 (note FIG. 1B).

That is, the boat frame 4 occupies a half circle on the circumference thereof and the front opening portion 5 occupies the remaining portion in order to allow the loading/unloading of the semiconductor substrate 100.

Also, the boat 1 further includes a boat cap capable of supporting the lower portion thereof and opening and closing the opening portion of the reaction chamber. The boat 1, in which the loading operation is completed, is putted into the reaction chamber through a lifting up and down device.

Generally, the holder 7 for supporting the semiconductor substrate 100 is mounted on the boat 1.

That is, it is necessary to mount the holder 7 on account of the characteristic of the heat treatment and the large diameter of the semiconductor substrate. Since the transformation of the semiconductor substrate starts at about 750° C. and the temperature of the reaction chamber is beyond the temperature, it is necessary to locally support 0.7 R (Radius) of the semiconductor substrate so as to prevent its fall.

More concretely, the semiconductor process in the reaction chamber includes the heat treatment process. For example, there are a deposition process, a heat treatment process for removing a COP (crystal originated particle), a diffusion process (well drive-in) for diffusing the dopant added to the semiconductor for doping into the semiconductor substrate, a oxide forming process of the semiconductor substrate and a SOI heat treatment process and so on. At this time, the environment of high temperature is required.

The large diameter (about 12 inch) of the semiconductor substrate is positively performed in order to improve the productivity of the semiconductor. Also, the supporting method of the semiconductor substrate is changed in the heat treatment process according to the process of the high temperature and the large aperture.

That is, since the transformation of the semiconductor substrate starts at about 750° C., the local support on the circumference of the wafer in the boat 2 brings about the fall of the semiconductor substrate.

Especially, in the course of the heat treatment process, a slip, which is a crystallization defect of a silicon lattice of the semiconductor substrate, can be more easily occurred on account of the large apeture of the wafer. In order to prevent this problem, the holder is used. The holder supports the lower portion located at 0.7 R (Radius) of the semiconductor substrate thereon so as to prevent its fall.

The material of the holder 7 is made of a ceramic type for example, a silicon carbide (SiC) so as to cope with the environment of high temperature and the chemical environment of the reaction process. Also, a supporting ring 9 for a target-support of the 0.7 R is formed at the supporting panel 8 of a circular plate type similar to the shape of the semiconductor substrate However, the conventional holder 7 brings about the manufacturing inconvenience on account of the manufacturing difficulty of the holder itself. Also, in order to supplement it, a peripheral device is used. However, there are various problems owing to the complexity of the peripheral device and so on.

FIG. 2 is a conceptual view illustrating a manufacturing method of the conventional holder. As shown in FIG. 2a as one example, the silicon carbide is mixed with a binder and it is precisely molded in the form of a holder. Here, since the binder includes impurities, the silicon carbide is coated on the mold surface of the holder type to complete the holder operation.

As shown in FIG. 2b as another example, the silicon carbide is thickly coated on a molding panel of a circular plate type and its circumference is cut and then, the molding panel (graphite) is incinerated. Thereafter, in order to form the supporting ring 9 on the silicon carbide panel, it is precisely treated again to complete the holder.

However, since the manufacturing methods of the conventional holder uses the silicon carbide of a high-price, there is a problem in that the productivity of semiconductor manufacturing device is deteriorated.

Also, the height of the supporting ring 9 is restricted on account of the occupying space of the supporting panel 8 and the supporting ring 9 of the holder.

Especially, where the semiconductor substrate 100 is seated on the holder 7, the holder 7 and semiconductor substrate 100 have one occupying space and it is necessary to consider the pitch of one unit and the working space of the end-effector 2 together.

In the batch type boat, the compact arrangement capable of minimizing the pitch is linked with the productivity (amount of the substrate treatment) of the semiconductor substrate 100.

As shown in FIG. 3, since the thickness of the holder 7 itself, that is, the thickness of the supporting panel 8 and the thickness of the supporting ring 9 and the working space "a" of the end-effector 2 of a robot arm between the holders 7 are ensured together, the pitch is increased, thereby decreasing the amount of the substrate treatment.

This problem is occurred in the top-edge-grip manner (FIG. 3a) and the bottom-lift manner (FIG. 3b) together. In order to load/unload the semiconductor substrate 100, it is necessary to ensure any thickness for ensuring the strength. At this time, it is also necessary to ensure the working space "a" for inserting the end-effector 2 between the holders 7.

In case of the top-edge-grip type, the working space "a" for drawing in and out the end-effector 2 and the height of the supporting ring 9 for the working space of the grip should be ensured.

Accordingly, the total pitch "P" is the sum of the total thickness of the end-effector 2, the working space "a", the thickness of the semiconductor substrate 100, the thickness of the supporting ring 9 and the thickness of the supporting panel 8 (note FIG. 3A).

In the meantime, in case of the bottom-lift type using the end-effector 2 of an U-shape, because the end-effector 2 is inserted between the supporting rings 9, the supporting ring 9 should be formed at a height providing the allowing space "a" equal to the total height of the end-effector 2. Accordingly, the pitch "P" is the sum of the lifting height and the thickness of the supporting panel (note FIG. 3B).

In the aspect of the working speed of the bottom-lift type, since the insertion process to the lower portion of the semiconductor substrate, the lifting process and the drawing-out process are performed in turns, the working speed is quickly and the gain of the pitch can be obtained in comparison with the top-edge-grip type. However, in case of using the silicon carbide so as to cope with the process of high-temperature, there is a problem in that the molding process for ensuring the height of the supporting ring is difficulty.

After all, the holder itself is complicated and the holder 7 having the supporting ring for performing the support of 0.7 R is required in the process of high-temperature for a large-diameter semiconductor, there are problems in that the manufacturing cost is high, the manufacturing process thereof is inconvenient and the productivity thereof is lowered.

SUMMARY OF THE INVENTION

Accordingly, the present invention has been made to solve the above-mentioned problems occurring in the prior art, and an object of the present invention is to provide a holder manufacturing method for loading a substrate of a semiconductor manufacturing device capable of simply manufacturing the holder.

Anther object of the present invention is to provide a batch type boat having the holder, in that the manufacture thereof is simple by means of a holder ring and the holder ring is supported on supporting rods and an end-effector escapes the supporting rods, so that the pitch interval can be minimized, whereby it can load the compact semiconductor substrate to the boat, the amount of the substrate treatment can be improved and thus the productivity thereof can be improved.

Further anther object of the present invention is to provide a loading/unloading method of the semiconductor substrate using the batch type boat and a semiconductor manufacturing device having the batch type boat.

To accomplish the objects, the present invention provides a manufacturing method of a holder of a boat for loading a semiconductor substrate comprising the steps of: molding a holder substrate of a pipe shape having inner and outer circumference of a predetermined size in such a manner that a lower portion of the semiconductor substrate is seated thereon; and forming a plurality of holder rings by cutting the holder rings from the holder substrate in such a manner that each holder ring is matched to a disposal interval of the semiconductor substrates in the boat.

To accomplish the objects, the present invention provides a loading/unloading method of a semiconductor substrate comprising the steps of protruding supporting rods from a boat frame of a batch type boat for treating the semiconductor substrate in bulk; supporting holder rings on the supporting rods; supporting a lower portion of the semiconductor substrate on a circular girth of each holder ring; preparing the end-effector for allowing a occupying space of the supporting rod; and loading/unloading the plurality of semiconductor substrates toward the batch type boat having a pitch interval except for a thickness of the supporting rod through the end-effector.

To accomplish the objects, the present invention provides a batch type boat for loading a semiconductor substrate of a semiconductor manufacturing device comprising: a plurality of supporting rods supporting a lower portion of the semiconductor substrate and formed at a boat frame of the boat for loading/unloading the semiconductor substrate; and a plurality of holder rings mounted on the supporting rods.

To accomplish the objects, the present invention provides s semiconductor manufacturing device having a batch type boat for mounting and treating a semiconductor substrate in bulk and an end-effector of a robot arm for loading/unloading the semiconductor substrate to the batch type boat comprising: a plurality of holder rings for supporting a lower portion of the semiconductor substrate on a circular girth thereof; a plurality of supporting rods supporting the semiconductor substrate by means of each holder ring and protruded from the boat frame in order to provide the working space of the end-effector, the end-effector for escaping an interference with the supporting rods located at a space between the holder rings vertically adjacent to each other; and the batch type boat having any pitch interval except for a thickness of the supporting rod 16 in order to support the holder ring by means of the supporting rod and the end-effector.

BRIEF DESCRIPTION OF THE DRAWINGS

The above as well as the other objects, features and advantages of the present invention will be more apparent from the following detailed description taken in conjunction with the accompanying drawings, in which.

DETAILED DESCRIPTION OF THE PREFERRED EMBODIMENTS

A preferred embodiment of the invention will be described in detail below with reference to the accompanying drawings.

Figure 5:
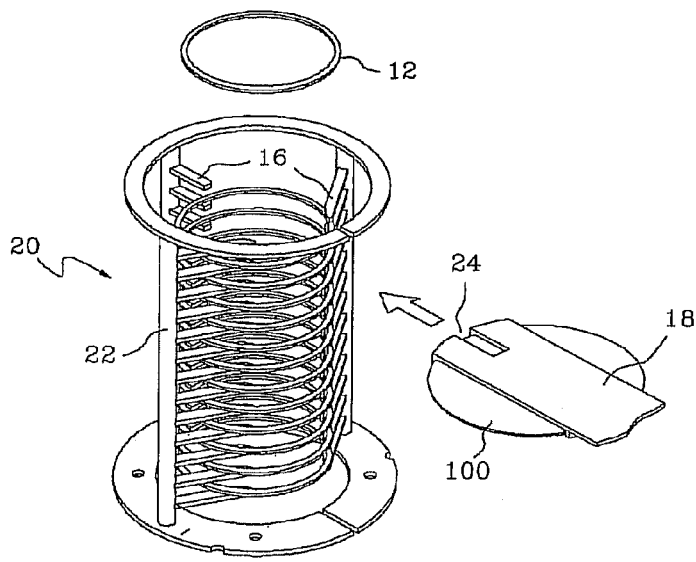
FIG. 5 is an explanatory view illustrating an external appearance of a semiconductor manufacturing device including a batch type boat having holder rings and an end-effector of a top-edge-grip type according to one embodiment of the present invention.
Figure 6:
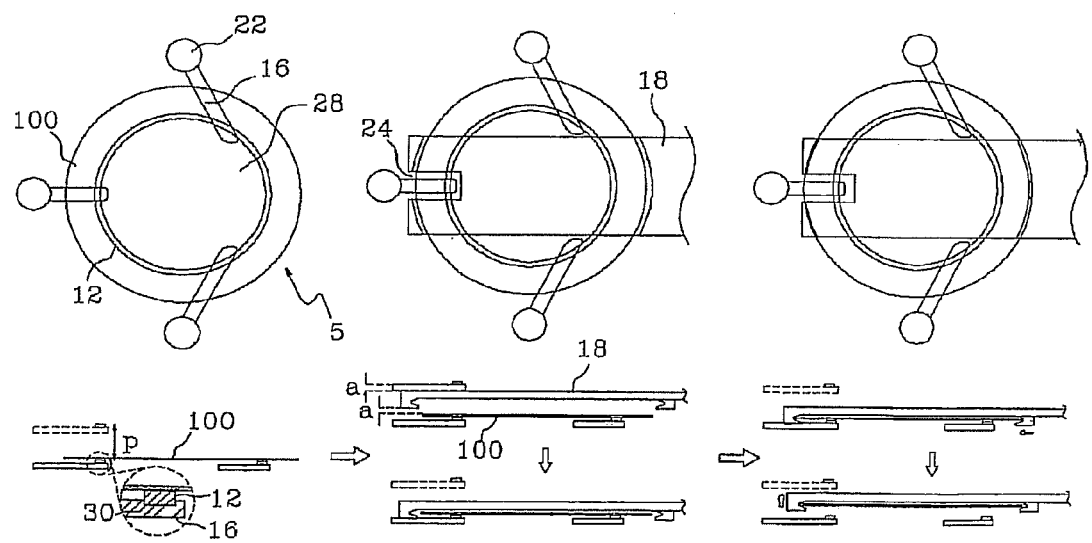
FIG. 6 is plan and side views of FIG. 5.

FIG. 4 is a conceptual view illustrating a manufacturing method of a holder ring according to the present invention. FIG. 5 is an explanatory view illustrating the external appearance of a semiconductor manufacturing device including a batch type boat having the holder rings and an end-effector of a top-edge-grip type according to one embodiment of the present invention. FIG. 6 is plan and side views of FIG. 5.

Figure 7:
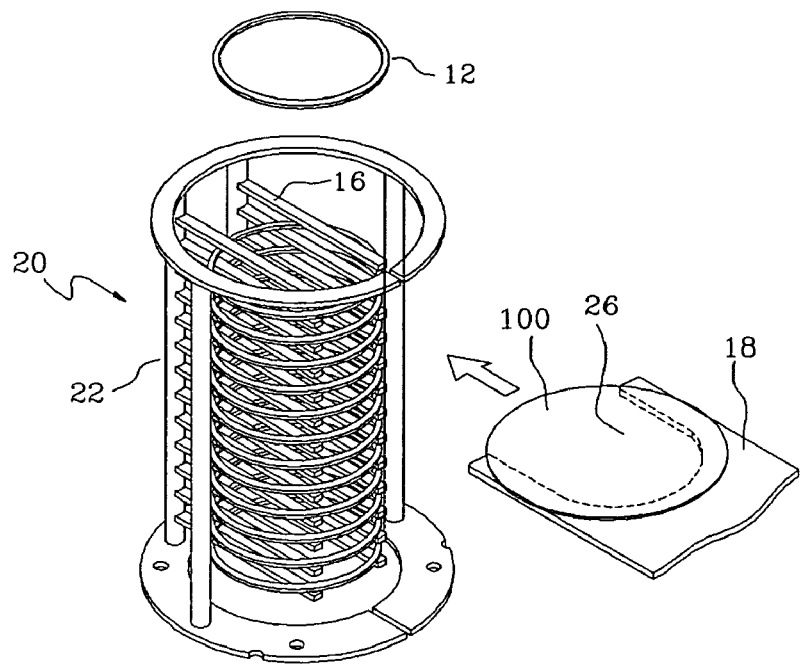
FIG. 7 is an explanatory view illustrating the external appearance of a semiconductor manufacturing device including a batch type boat having the holder rings and an end-effector of a bottom-lift type according to another embodiment of the present invention.
Figure 8:
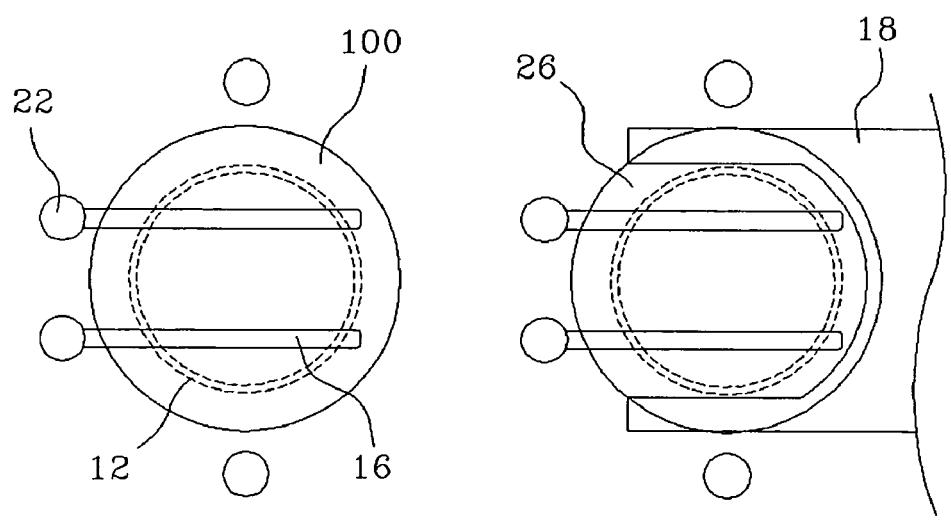
FIG. 8 is plan and side views of FIG. 7.
Figure 8:
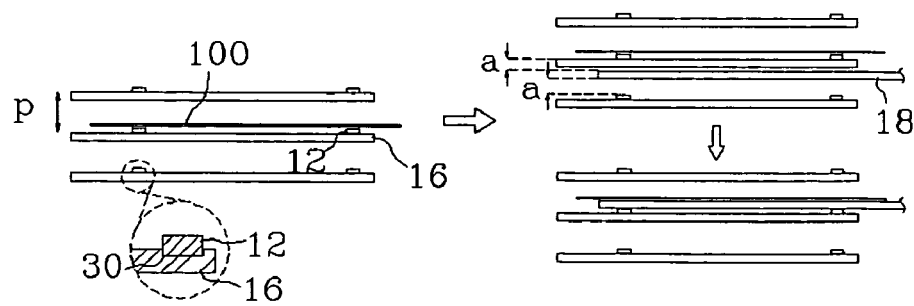

Also, FIG. 7 is an explanatory view illustrating the external appearance of a semiconductor manufacturing device including a batch type boat having the holder rings and an end-effector of a bottom-lift type according to another embodiment of the present invention. FIG. 8 is plan and side views of FIG. 7.

Firstly, as shown in FIG. 4, a holder according to the present invention includes a supporting panel of a circular plate type and a plurality of holder rings for safely seating each lower portion of semiconductor substrates disposing thereon and integrally formed on the supporting panel.

A manufacturing method of the holder of the boat for loading the semiconductor substrate 100 includes the steps of forming a holder substrate 10 of a pipe shape having inner and outer circumference of a predetermined size in such a manner that the lower portion of the semiconductor substrate 100 is seated thereon, and forming a plurality of holder rings 12 by cutting the holder rings 12 from the holder substrate 12 in such a manner that each holder ring is matched to a disposal interval of the semiconductor substrates 100 in the boat 20.

Figure 1A:
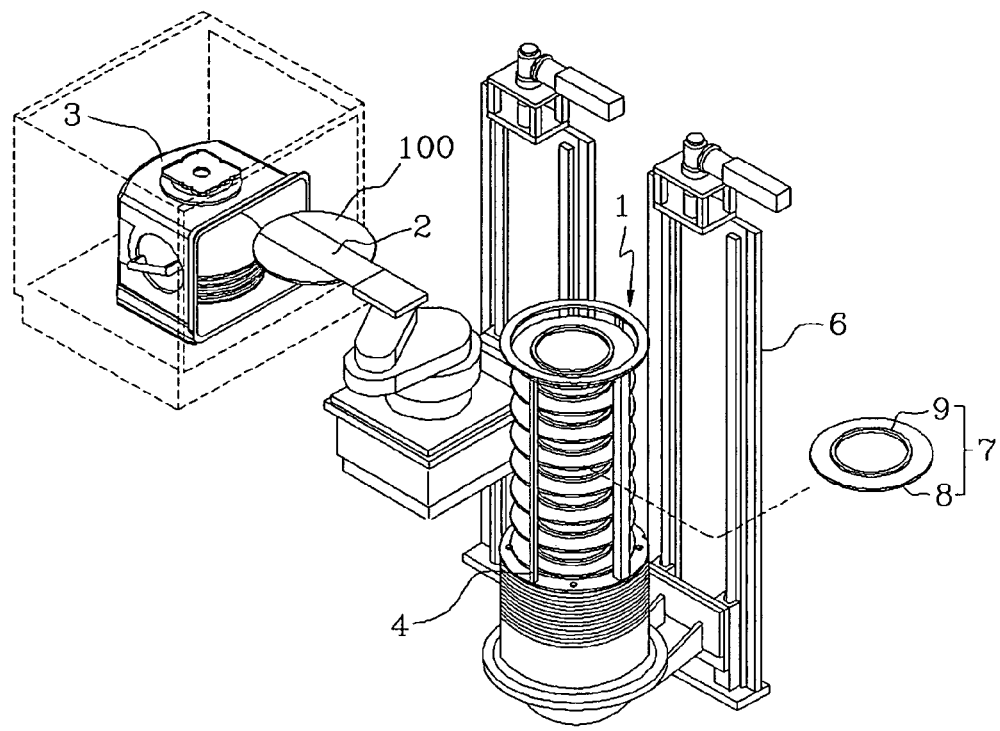
FIG. 1A and FIG. 1B are explanatory views illustrating external appearances of conventional semiconductor manufacturing device including a batch type boat for loading a plurality of semiconductor substratess.
Figure 1B:
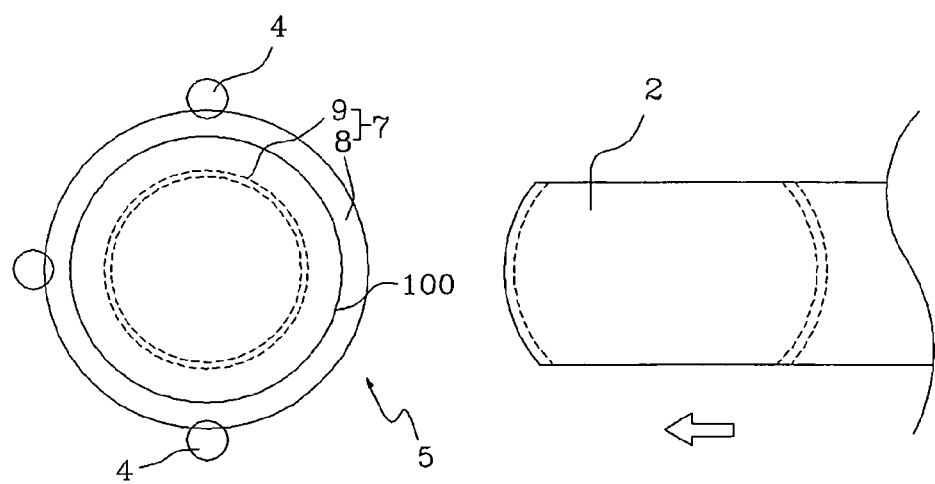
Figure 2A:
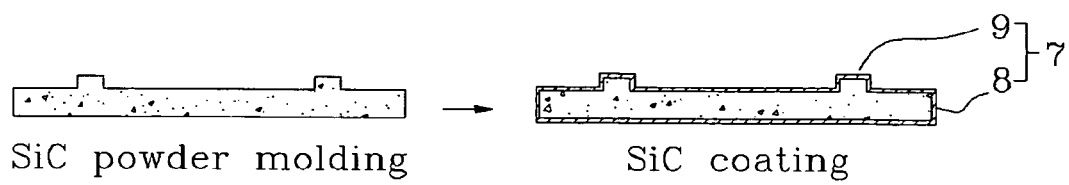
FIG. 2A and FIG. 2B are conceptual views illustrating manufacturing methods of the conventional holder.
Figure 2B:
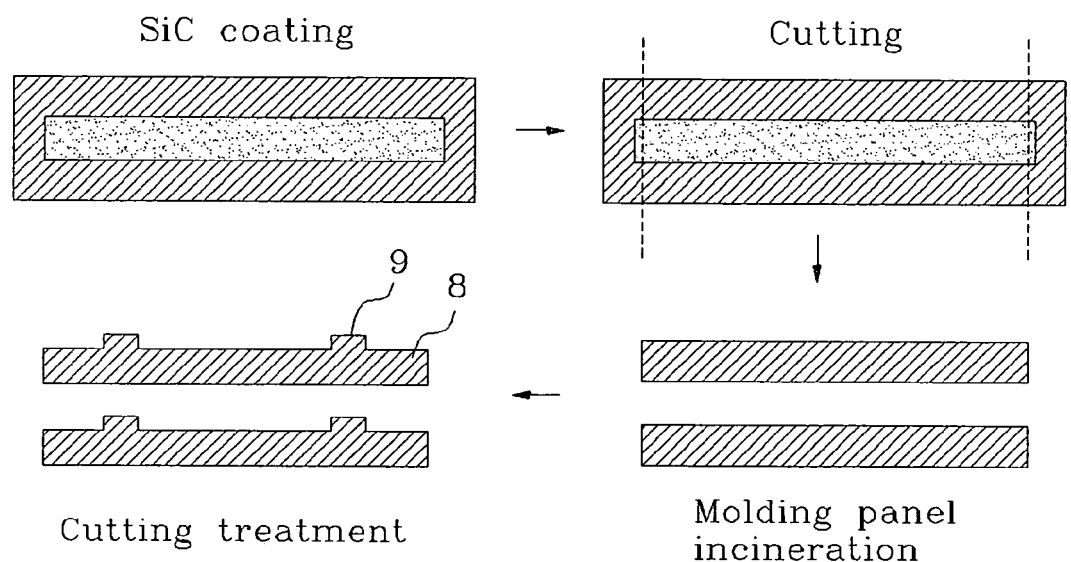
Figure 3A:
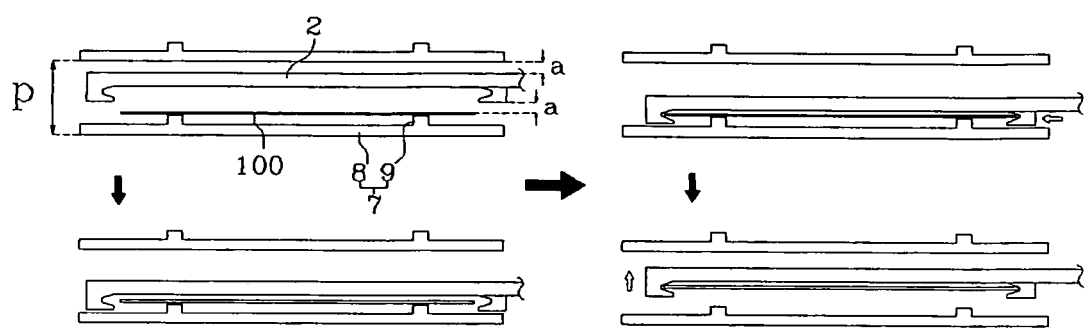
FIG. 3A and FIG. 3B are explanatory views illustrating working statuses of a conventional end-effector.
Figure 3B:
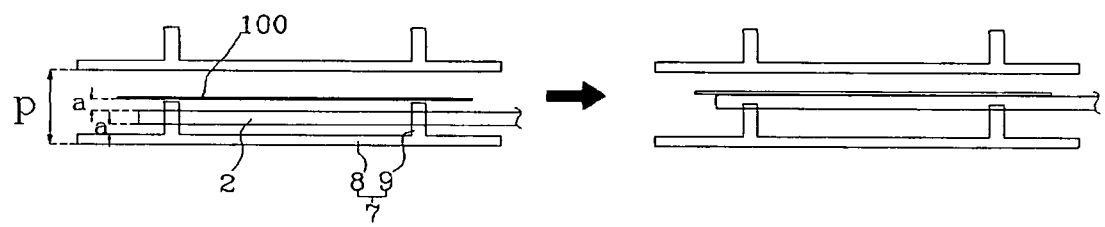
Figure 4A:
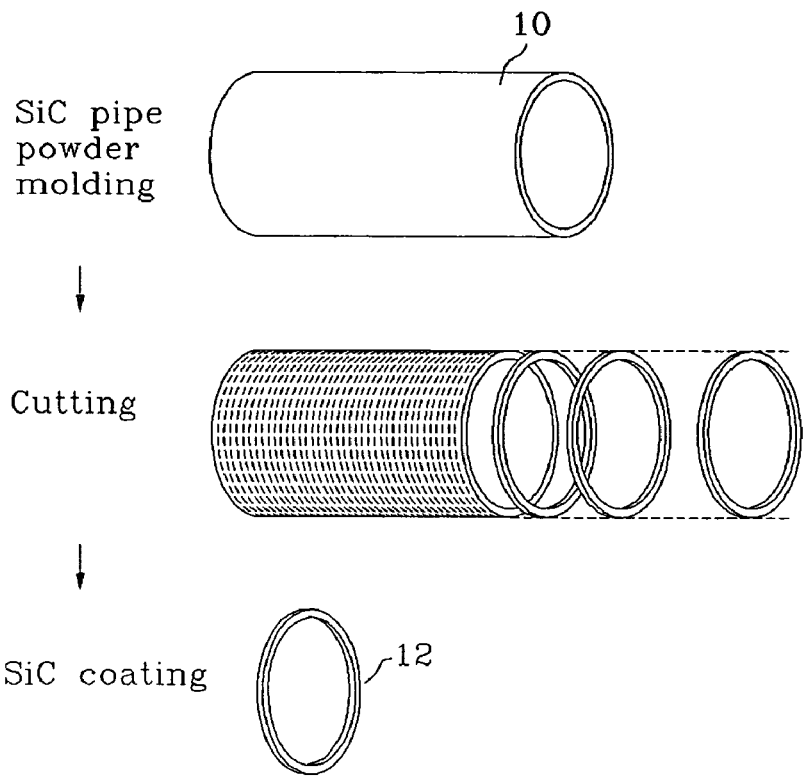
FIG. 4A and FIG. 4B are conceptual views illustrating manufacturing methods of a holder ring according to the present invention.

Here, as shown in FIG. 4a, in the manufacturing method of the holder ring 12 according to one embodiment of the present invention, the holder substrate 10 of the pipe shape is powder-molded through a silicon carbide powder and the silicon carbide is also, coated on the cut holder rings 12.

Figure 4B:
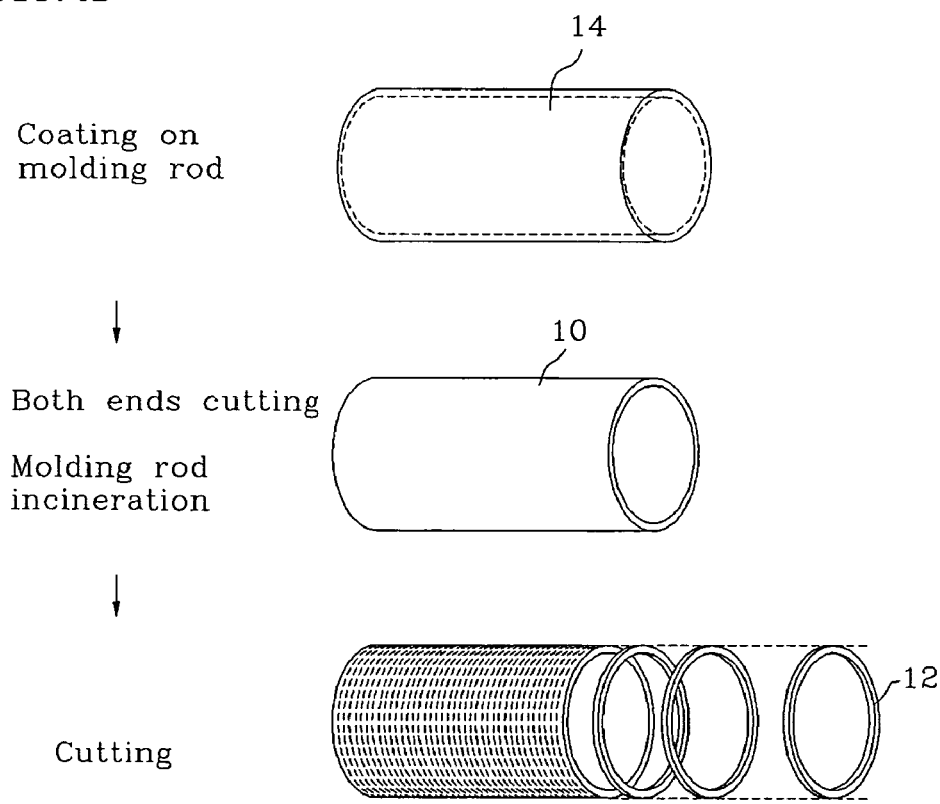

Also, as shown in FIG. 4b, in the manufacturing method of the holder ring 12 according to another embodiment of the present invention, the holder substrate 10 of the pipe shape is molded by coating the silicon carbide on a graphite molding rod 14 and the graphite molding rod 14 is removed from the holder substrate 10 and then, the holder substrate 10 is cut.

In the holder ring 12 manufactured by the above methods, the lower portion of the semiconductor substrate 100 is supported on the circular girth thereof as described above. Here, with the mounting of the holder ring 12, the manufacturing of the holder is simple and the gain of the pitch thereof is obtained.

A loading/unloading method of the semiconductor substrate 100 using the holder ring 12 according to the present invention includes the steps of protruding supporting rods 16 from a boat frame of the batch type boat 20 for treating the semiconductor substrate 100 in bulk, supporting the holder rings 12 on the supporting rods 16, supporting the 0.7 R lower portion of the semiconductor substrate 100 on the circular girth of each holder ring 12, preparing the end-effector 18 for allowing (escaping) a occupying space of the supporting rod 16 in its planar view and a vertical occupying space (thickness) of the supporting rod 16 having any thickness secured by the supporting of the holder ring 12, and loading/unloading the plurality of semiconductor substrates 100 toward the batch type boat 12 having a pitch interval except for the thickness of the supporting rod 16 through the end-effector 18.

As shown in FIG. 5 and FIG. 6, in the loading/unloading method of the semiconductor substrate 100 according to one embodiment of the present invention, in order to allow the occupying space of the supporting load 16 through the end-effector 18, the supporting rods 16 are internally protruded from the boat frame 22 located at the outside of the holder ring 12 in such a manner that the holder ring 12 is divided equally at an angle of 120 degrees to support the holder ring 12 by three spots, the lower space of the semiconductor substrate 100 is closed by the supporting rods 16 for interfering in the holder ring 12 and the outside space of the holder ring 12, and the upper space of the semiconductor substrate 100 except for the occupying space of the supporting rod 16 is exposed to outside, in order to perform the loading/unloading of the semiconductor substrate 100 by means of the end-effector 18 of the top-edge-grip type. Here, the end-effector 18 has a width for inserting between two supporting rods 16 protruded on both sides in regard to the working path in its planar view and an escape groove 24 for escaping the interference of the remaining one supporting rod 16 protruded in the inner direction in regard to the working path in its planar view.

As shown in FIG. 7 and FIG. 8, in the loading/unloading method of the semiconductor substrate 100 according to another embodiment of the present invention, in order to allow the occupying space of the supporting load 16 through the end-effector 18, a pair of the supporting rods 16 is penetrated through the inner circumference of the holder ring 12 at the lower portion thereof in the direction of the working path of the end-effector 18 in such a manner that the holder ring 12 is supported on the supporting rods by four spots, thus a space between the lower portion of the semiconductor substrate 100 and the adjacent semiconductor substrate 100 down is exposed, whereby the loading/unloading of the semiconductor substrate is performed by means of the end-effector 18 of the bottom-lift type having a holder ring receiving groove 26 of a U-shape for receiving the holder ring 12.

Also, as shown in FIG. 5 through FIG. 8, a boat for loading a semiconductor substrate of a batch type semiconductor manufacturing device includes a plurality of supporting rods 16 for supporting the lower portion of the semiconductor substrate 100 formed at the boat frame 22 of the boat 20 for loading/unloading the semiconductor substrate 100, and a plurality of holder rings 12 mounted on the supporting rods 16 and cut from the holder substrate 10 of a pipe shape having inner and outer circumference of a predetermined size for seating the lower portion of the semiconductor substrate 100 in such a manner that each holder ring 12 is matched to a disposal interval of the semiconductor substrates 100 in the boat 20.

Moreover, a semiconductor manufacturing device having the batch type boat 20 for mounting and treating the semiconductor substrate 100 in bulk and the end-effector 18 of a robot arm for loading/unloading the semiconductor substrate 20 to the batch type boat 20 comprises the holder rings 12 for supporting the lower portion of the semiconductor substrate 100 on the circular girth thereof, the supporting rods 16 supporting the semiconductor substrate 100 by means of each holder ring 12 and protruded from the boat frame 22 in order to provide the working space of the end-effector 18, the end-effector 18 for escaping the interference with the supporting rods 16 located at a space between the holder ring 12 vertically adjacent to each other, and the batch type boat 20 having any pitch interval except for the thickness of the supporting rod 16 in order to support the holder ring by means of the supporting rod 16 and the end-effector 18.

As shown in FIG. 5 and FIG. 6, in order to secure the drawing out and in path toward the boat 20 for the loading/unloading of the semiconductor substrate 100, the supporting rods 16 are internally and radially protruded from the boat frame 22 having a front opening portion, thus the end-effector 18 of the top-edge-grip type has a width for inserting between two supporting rods 16 protruded on both sides in regard to the working path in its planar view and the escape groove 24 for receiving the remaining one supporting rod 16 protruded in the inner direction in regard to the working path and gripping the semiconductor substrate 100 in such a manner that the working is performed in the internal space of the holder ring 12 capable of escaping the planar occupying space of the supporting rod 16 in a case that the outer space of the holder ring 12 is occupied by the supporting rod 16.

Here, the holder ring 12 is divided equally at an angle of 120 degrees to support the holder ring 12 on the supporting rods 16 by three spots.

That is, the supporting rods 16 are protruded from the boat frame 22 toward the three spots of the lower portion of the circumference of each holder ring 12 divided equally at an angle of 120 degrees. Accordingly, where the semiconductor substrate 100 is drawn out and in, an opening portion 28 is formed in such a manner that the interval between two spots protruded from both side of the boat frame 22 having the front opening portion 5 is larger than the width of the end-effector 18 in regard to the working path thereof, so that the working can be easily performed.

As shown in FIG. 7 and FIG. 8, in the end-effector 18 of the bottom-lift type according to another embodiment of the present invention, a pair of the supporting rods 16 is penetrated through the inner circumference of the holder ring 12 in such a manner that the holder ring 12 is supported on the supporting rods by four spots, thus the end-effector 18 includes the holder ring receiving groove 26 having any size for receiving the holder ring 12 in such a manner that the working is performed between the exposed holder rings 12 in a case that the inner space of the holder ring 12 is occupied by the supporting rod 16.

Also, a pair of the boat frames 22 is formed at the extension line of the working path of the end-effector 18 and a pair of the supporting rods 16 is penetrated through the inner circumference of the holder ring 12 at the boat frames 22.

Here, the holder ring 12, the boat frame 22 and the supporting rod 16 are made of the silicon carbide or its equivalents.

In the meantime, the holder ring 12, the boat frame 22 and the supporting rod 16 can be made of quartz. Also, the present invention may be applied to the semiconductor manufacturing device except for a process of a high temperature on account of the manufacturing convenience and the gain of the pitch thereof.

As described above, the present invention is provided to a simple semiconductor manufacturing method and a device thereof in that the capacity of the substrate treatment is improved and the manufacturing method is simple by means of the batch type boat having a compact pitch interval and a simple holder.

Accordingly, the holder according to the present invention having supporting rings integrally molded therein and supporting 0.7 R of the semiconductor substrate 100 includes the holder rings 12 having only supporting ring to the exclusion of the supporting panel, the boat 20 for supporting the holder rings 12 therein, and the supporting rods 16 having no effect on the pitch interval, whereby ensuring the compact pitch interval.

The present invention is divided into two embodiments according to the supporting manner of the holder ring 12 through the supporting rod 16 and the structure of the end-effector 18 corresponding to the holder ring 12. Firstly, the holder ring 12 according to one embodiment of the present invention is manufactured by the manufacturing method of FIG. 4.

FIG. 4A illustrates the manufacturing method of the holder ring according to one embodiment of the present invention in that the holder substrate 10 of the pipe shape is powder-molded through the silicon carbide powder, the holder substrate 10 is cut to any thickness of the holder ring, and then the silicon carbide is coated on the cut holder rings 12.

Also, FIG. 4B illustrates the manufacturing method of the holder ring according to second embodiment of the present invention, in that the holder substrate 10 of the pipe shape is molded by coating the silicon carbide on a graphite molding rod 14 and the graphite molding rod 14 is removed from the holder substrate 10 and then, the holder substrate 10 is cut.

Accordingly, since the holder rings 12 are cut from the holder substrate 10 of the pipe shape, the separate molding instrument for individually manufacturing the conventional holder is unnecessary. Also, because the conventional process such as the cutting molding and so on is deleted, the productivity of the holder can be maximized.

According to the providing of the holder ring 12, the plurality of supporting rods 16 for supporting the lower portion of the semiconductor substrate 100 is formed at the boat frame 22 of the boat 20 for loading/unloading the semiconductor substrate 100 and the boat 20 for loading the semiconductor substrate 10 of the batch type semiconductor manufacturing device and having the holder rings 12 is provided.

Concretely, the function of the supporting panel of the conventional holder is performed by the boat 20 of the present invention. On this account, the holder rings 12 are arranged at the boat through the supporting rods 16.

That is, the supporting rods 16 are mounted on the boat frame 22 of the boat 20 and protruded toward the inside of the boat 20 owing to the inside disposal of the holder ring 12 in the boat 20.

Also, a seating groove 30 for seating the holder ring 12 is formed at the upper end of the supporting rod 16. That is, the holder ring 12 is inserted into the seating groove 30 to ensure the supporting location (note FIG. 6 and FIG. 8).

The supporting rod 16 of the present invention is divided into two embodiments according to the supporting manner.

As shown in FIG. 5 and FIG. 6, the end-effector 18 of the top-edge-grip type according to one embodiment of the present invention is adopted to the semiconductor substrate 200 through the supporting rod 16 occupying the outer area of the holder ring 12. That is, the loading/unloading operation is performed in the inside of the space occupied by the supporting rod 16 located at the upper portion of the semiconductor substrate 100.

Here, the supporting rods 16 are protruded from the boat frame 22 and the lower portion of the circumference of each holder ring 12 is divided equally and supported thereon.

The boat frame 22 is formed at the semi-circumference in order to form the front opening portion 5 as described above.

Here, when three supporting rods 16 are protruded in the central direction, since the holder ring 12 is supported on the supporting rods by three spots in the semi-circumference thereof, the support of the holder ring 12 can be unstable.

Accordingly, both supporting rods 16 protruded from the boat frame 22 located at the front opening portion are slanted radially and divided equally at an angle of 120 degrees from the other supporting rod 16 located at the center line of the working path, in order to stably support the holder ring 12.

Accordingly, the holder ring 12 can be stably supported on the three supporting rods.

By means of the supporting rods 16 and the holder ring 12, the lower space of the semiconductor substrate 100 is closed and the upper space of the semiconductor substrate 100 except for the supporting rods 16 is opened to outside.

Concretely, the outer space of the holder ring 12 is occupied by the two supporting rods 16 and is interfered by one protruded supporting rod 16 at the center line in regard to the drawing out and in path in its planar view.

Therefore, it is necessary to adopt the end-effector 18 of the top-edge-grip type. The end-effector 18 of the top-edge-grip type has the width for inserting between two supporting rods 16 protruded on both sides in regard to the working path and the escape groove 24 for receiving the remaining one supporting rod 16 protruded in the inner direction in regard to the working path and gripping the semiconductor substrate 100.

By means of the supporting rods 16 and the end-effector 18 of the top-edge-grip type, it is unnecessary to consider the thickness of the supporting rod 16 as well as ensure the height (thickness) of the holder ring 12 for gripping the semiconductor substrate 100 on the supporting rods 16.

That is, as shown in FIG. 6, the pitch "P" is the interval between holder rings 12. Here, since the end-effector 18 escapes the supporting rod 16, the working space "a" of the end-effector 18 is settled by the holder ring 12 and the semiconductor substrate 100.

Also, when the grip of the end-effector 18 goes down, it can escape the interference with the supporting rod 16 owing to the escape groove 24, thereby minimizing the thickness of the holder ring 12. Accordingly, the pitch interval is determined by the minimized thickness (about 1 mm: including insertion thickness of the seating groove 30), the thickness (about 1 mm) of the semiconductor substrate 100 and the working space (about 3.5 mm) of the end-effector 18.

Here, in a case that the end-effector 18 does not escape the supporting rod 16, it is approximately doubled in pitch. For example, in order to ensure its strength, since the supporting rod 16 is protruded from the supporting frame occupying the most external angle of the boat 20 to the lower portion of the holder ring 12 supporting 0.7 R thereof, the predetermined thickness (about 4-5 mm) for supporting and the added height of the holder ring 12 for working space of the grip are necessary.

Also, the supporting panel and the holder having the supporting ring are applied in the same manner as described above.

Accordingly, it can be seen that the difference can be surely occurred in productivity in the reaction chambers having the same working space according to yes or no of the escape of the occupying space of the supporting rod 16.

In the meantime, FIG. 7 and FIG. 8 illustrate the end-effector of the bottom-lift type according to another embodiment of the present invention. That is, since the lower portion (outer space) of the semiconductor substrate 100 is exposed to outside through the holder ring 12 and the supporting rods 16 occupying the inside of the holder ring 12, the end-effector of the bottom-lift type is adopted.

That is, the pair of the supporting rods 16 is penetrated through the inner circumference of the holder ring 12 at the lower portion thereof in the direction of the working path of the end-effector 18, so that the holder ring 12 is supported on the supporting rods 16 by four spots.

Preferably, it inscribes a regular square in the central circumference of the holder ring 12, so that the outside of the holder ring 12 is open to the working space of the end-effector 18.

Accordingly, the holder ring 12 is stably supported on the supporting rods 16 and it can obtain more rapid loading/unloading of the semiconductor substrate 100 and the gain of pitch by means of the end-effector of the bottom-lift type.

The end-effector 18 of the bottom-lift type has the holder ring receiving groove 26 of a U-shape for receiving the holder ring 12, so that it is unnecessary to consider the thickness of the supporting rod 16 as the pitch thereof.

That is, as shown in FIG. 8, the pitch "P" is the interval between holder rings 12. Here, since the end-effector 18 escapes the supporting rod 16 in its planar view, the working space "a" of the end-effector 18 is settled by the holder ring 12 and the semiconductor substrate 100.

Moreover, since the grip protruded down as in the end-effector 18 of the top-edge-grip type does not exist, the gain of the pitch is larger than that of one embodiment of the present invention. Furthermore, because the working time of the grip is unnecessary in the course of the loading/unloading, the working speed can be quickly.

Here, since the holder ring 12 is supported on the supporting rods 16 by four spots, not three spots, the processing details of the supporting rod 16 is required.

Accordingly, it considers the thickness of the holder ring 12, the thickness of the semiconductor substrate 100 and the working space of the end-effector 18 between the holder rings 12 as the pitch and the thickness of the holder ring 12 for supporting the semiconductor substrate 100 can be minimized, thereby obtaining a plenty of holder rings from one holder substrate and a compact arrangement.

As can be seen from the foregoing, in the holder manufacturing method for loading the substrate of the semiconductor manufacturing device, the batch type boat having the holder, a loading/unloading method of a semiconductor substrate using the same, and a semiconductor manufacturing device having the same, there are effects in that the manufacture of the holder and the batch type boat are simple by means of the holder ring, the holder ring is supported on supporting rods and the end-effector escapes the supporting rods, so that the pitch interval can be minimized, whereby it can load the compact semiconductor substrate to the boat, the amount of the substrate treatment can be improved and thus the productivity thereof can be improved.

While this invention has been described in connection with what are presently considered to be the most practical and preferred embodiments, it is to be understood that the invention is not limited to the disclosed embodiments and the drawings, but, on the contrary, it is intended to cover various modifications and variations within the spirit and scope of the appended claims.

What is claimed is:

1. A loading/unloading method of a semiconductor substrate using an end-effector of a robot arm from a batch type boat for treating the semiconductor substrate in bulk, said batch type boat having supporting rods protruding from a boat frame, said method comprising the steps of:
   supporting holder rings on the supporting rods;
   causing the end-effector to support the semiconductor substrate, said end-effector comprising a groove;

inserting the end-effector into the batch type boat, wherein at least one of the supporting rods is temporarily inserted into the groove of the end-effector during insertion of the end-effector and the semiconductor substrate into the batch type boat, and wherein in order to allow the occupying space of the at least one supporting rod to be temporarily inserted into the groove of the end-effector, a pair of the supporting rods is penetrated through an inner circumference of the holder ring at a lower portion thereof in the direction of a working path of the end-effector in such a manner that the holder ring is supported on the supporting rods by four spots and to thereby maintain a space between a lower portion of the semiconductor substrate and an adjacent semiconductor substrate; and loading/unloading the plurality of semiconductor substrates through insertion and selective supporting and removal of the plurality of semiconductor substrates from the end-effector, wherein the loading/unloading of the semiconductor substrate is performed by means of the end-effector of a bottom-lift type having a holder ring receiving groove for receiving the holder ring.

2. A semiconductor manufacturing device having a batch type boat for mounting and treating a semiconductor substrate in bulk and an end-effector of a robot arm for loading/unloading the semiconductor substrate to the batch type boat comprising:

a plurality of holder rings for supporting a lower portion of the semiconductor substrates on a circular girth thereof;

a plurality of supporting rods supporting the semiconductor substrates by means of each of the plurality of holder rings, wherein each of the plurality of supporting rods protrudes from the boat frame and provides a working space of the end-effector, wherein the end-effector is a bottom-lift type end-effector having a holder ring receiving groove for receiving the holder ring and at least one of the plurality of supporting rods for escaping an interference with the at least one of the plurality of supporting rods when the end-effector moves into the batch type boat for loading/unloading the semiconductor substrates, wherein each of the plurality of supporting rods is located at a space between the plurality of holder rings, and wherein the plurality of holder rings are vertically adjacent to each other, wherein in order to allow the occupying space of the at least one supporting rod to be temporarily inserted into the groove of the end-effector, a pair of the supporting rods is to be penetrated through an inner circumference of the holder ring at a lower portion thereof in the direction of a working path of the end-effector in such a manner that the holder ring is supported on the supporting rods by four spots and to thereby maintain a space between a lower portion of the semiconductor substrate and an adjacent semiconductor substrate; and the batch type boat having any pitch interval except for a thickness of each of the plurality of supporting rods in order to support the holder ring by means of the plurality of supporting rods and the end-effector.

3. A semiconductor manufacturing device as claimed in claim 2 wherein the boat frame comprises a pair of boat frames formed at an extension line of a working path of the end-effector and a pair of the supporting rods comprises a first supporting rod connected to and extending substantially perpendicularly from one of the pair of boat frames and a second supporting rod connected to and extending substantially perpendicularly from the other of the pair of boat frames, and wherein the first and second supporting rods extend substantially parallel with respect to each other along a common plane is penetrated through the inner circumference of the holder ring at the boat frames in its planar view, in order to support the holder ring on the supporting rods penetrated through an inside space of a circumference of the hold ring in its planar view by four spots.

4. A semiconductor manufacturing device as claimed in claim 2, wherein in a case that an inner space of the holder ring is occupied by the supporting rod penetrated through an inner circumference of the holder ring in such a manner that the holder ring is supported on the supporting rods by four spots in its planar view, the end-effector comprises a holder ring receiving groove having any size for receiving the holder ring in such a manner that a working is performed between exposed holder rings.

5. A semiconductor manufacturing device as claimed in claim 2 wherein the holder ring and the boat are made of a silicon carbide.

6. A semiconductor manufacturing device as claimed in claim 2 wherein the holder ring and the boat are made of quartz.

7. A semiconductor manufacturing device as claimed in claim 2 wherein a seating groove for seating the holder ring is formed at the supporting rod.

8. A loading/unloading method of a semiconductor substrate using an end-effector of a robot arm from a batch type boat for treating the semiconductor substrate in bulk, said batch type boat having supporting rods protruding from a boat frame, said method comprising the steps of:

supporting holder rings on the supporting rods;

causing the end-effector to support the semiconductor substrate, said end-effector comprising a groove;

inserting the end-effector into the batch type boat, wherein at least one of the supporting rods is temporarily inserted into the groove of the end-effector during insertion of the end-effector and the semiconductor substrate into the batch type boat; and loading/unloading the plurality of semiconductor substrates through insertion and selective supporting and removal of the plurality of semiconductor substrates from the end-effector, wherein in order to allow an occupying space of the at least one supporting rod to be temporarily inserted into the groove of the end-effector, the supporting rods are internally protruded from the boat frame located at an outside of the holder ring in such a manner that the holder ring is divided equally at an angle of 120 degrees to support the holder ring by three spots, a lower space of the semiconductor substrate is closed by the supporting rods for interfering in the holder ring and an outside space of the holder ring, and an upper space of the semiconductor substrate except for an occupying space of the supporting rod is exposed to outside, in order to perform the loading/unloading of the semiconductor substrate by means of the end-effector of a top-edge-grip type, and the end-effector having a width for inserting between two supporting rods protruded on both sides in regard to a working path in its planar view and an escape groove for escaping an interference of the remaining one supporting rod protruded in an inner direction in regard to the working path in its planar view.

9. A semiconductor manufacturing device having a batch type boat for mounting and treating a semiconductor substrate in bulk and an end-effector of a robot arm for loading/unloading the semiconductor substrate to the batch type boat comprising:

a plurality of holder rings for supporting a lower portion of the semiconductor substrates on a circular girth thereof;

a plurality of supporting rods supporting the semiconductor substrates by means of each of the plurality of holder rings, wherein each of the plurality of supporting rods internally protrudes from the boat frame located at an outside of the holder ring in such a manner that the holder ring is divided equally at an angle of 120 degrees to support the holder ring by three spots, each of the plurality of supporting rods provides a working space of the end-effector, wherein the end-effector is a top-edge-grip type end-effector and has a width to be inserted between two supporting rods protruded on both sides in regard to a working path in its planar view, the end-effector further comprises an escape groove for escaping an interference of the remaining one supporting rod protruded in an inner direction in regard to the working path in its planar view, a lower space of the semiconductor substrate is closed by the supporting rods for interfering in the holder ring and an outside space of the holder ring, and an upper space of the semiconductor substrate except for an occupying space of the supporting rod is exposed to outside; and the batch type boat having any pitch interval except for a thickness of each of the plurality of supporting rods in order to support the holder ring by means of the plurality of supporting rods and the end-effector.

10. A semiconductor manufacturing device as claimed in claim 9 wherein the supporting rods protrude from the boat frame toward three spots of a lower portion of a circumference of each holder ring divided equally at an angle of 120 degrees and the groove is formed in such a manner that an interval between two spots protruding from both sides of the boat frame having a front opening portion is larger than a width of the end-effector in regard to a working path thereof in order to draw in or out the semiconductor substrate.

11. A semiconductor manufacturing device as claimed in claim 9, wherein in a case that the outer space of the holder ring is occupied by the supporting rods internally and radially protruded from the boat frame having the front opening portion in order to support the holder ring on the supporting rods by three spots, the end-effector of a top-edge-grip type has a width for inserting the end-effector between two supporting rods protruded on both sides in regard to a working path in its planar view and an escape groove for receiving a supporting rod protruded to a working path line and gripping the semiconductor substrate in such a manner that a working is performed in an internal space of the holder ring capable of escaping an occupying space of the supporting rod in its planar view.

* * * * *